United States Patent
Chen et al.

(10) Patent No.: US 12,057,838 B2
(45) Date of Patent: Aug. 6, 2024

(54) LOW-JITTER DIGITAL ISOLATOR CIRCUIT AND DIGITAL ISOLATOR INCLUDING THE SAME

(71) Applicant: SUZHOU NOVOSENSE MICROELECTRONICS CO., LTD., Suzhou (CN)

(72) Inventors: Qihui Chen, Suzhou (CN); Xiaohan Gong, Suzhou (CN); Yun Sheng, Suzhou (CN)

(73) Assignee: SUZHOU NOVOSENSE MICROELECTRONICS CO., LTD., Suzhou (CN)

( * ) Notice: Subject to any disclaimer, the term of this patent is extended or adjusted under 35 U.S.C. 154(b) by 145 days.

(21) Appl. No.: 17/780,491

(22) PCT Filed: Feb. 10, 2020

(86) PCT No.: PCT/CN2020/074623
§ 371 (c)(1),
(2) Date: May 26, 2022

(87) PCT Pub. No.: WO2021/142864
PCT Pub. Date: Jul. 22, 2021

(65) Prior Publication Data
US 2023/0006675 A1    Jan. 5, 2023

(30) Foreign Application Priority Data
Jan. 14, 2020 (CN) .......................... 202010034512.5

(51) Int. Cl.
*H03K 19/20* (2006.01)
(52) U.S. Cl.
CPC .................................. *H03K 19/20* (2013.01)

(58) Field of Classification Search
CPC .............................. H03K 19/20; Y02D 10/00
See application file for complete search history.

(56) References Cited

U.S. PATENT DOCUMENTS

| 2005/0058189 | A1* | 3/2005 | Yip | ................... | H04L 25/03133 |
| | | | | | 375/222 |
| 2006/0001478 | A1* | 1/2006 | Do | ....................... | G11C 29/021 |
| | | | | | 327/538 |
| 2008/0159360 | A1* | 7/2008 | Florence | ............. | H04L 25/0268 |
| | | | | | 375/211 |

FOREIGN PATENT DOCUMENTS

| CN | 207910757 U | 9/2018 |
| CN | 108988831 A | 12/2018 |

(Continued)

*Primary Examiner* — Daniel D Chang
(74) *Attorney, Agent, or Firm* — Cheng-Ju Chiang (57) ABSTRACT

Provided are a low-jitter digital isolator circuit and a digital isolator including the same. The digital isolator circuit includes a signal transmitting module, a signal receiving module, and an isolation channel connected between the signal transmitting module and the signal receiving module. The signal transmitting module is provided with a signal input terminal, and the signal receiving module is provided with a signal output terminal. The signal transmitting module includes a reset circuit, an oscillator and a transmitting circuit which are sequentially connected. The reset circuit is connected to the signal input terminal. The transmitting circuit is connected to the isolation channel. The signal receiving module includes a receiving circuit connected to the isolation channel. In the present invention, signal jitter is reduced, more stable signal transmission and a better isolation effect are achieved, and the area and cost of the digital isolator circuit are reduced.

8 Claims, 4 Drawing Sheets

(56) References Cited

FOREIGN PATENT DOCUMENTS

| CN | 110086464 A | 8/2019 |
|----|-------------|--------|
| CN | 110417401 A | 11/2019 |

* cited by examiner

LOW-JITTER DIGITAL ISOLATOR CIRCUIT AND DIGITAL ISOLATOR INCLUDING THE SAME

CROSS-REFERENCE TO RELATED APPLICATION

The present application is a 35 U.S.C. § 371 National Phase conversion of International (PCT) Patent Application No. PCT/CN2020/074623, filed on Feb. 10, 2020, which claims priority to Chinese Patent Application No. 202010034512.5, filed on Jan. 14, 2020, and titled "LOW-JITTER DIGITAL ISOLATOR CIRCUIT AND DIGITAL ISOLATOR INCLUDING THE SAME", which is incorporated herein by reference in its entirety. The PCT International Patent Application was filed and published in Chinese.

TECHNICAL FIELD

The present invention relates to the field of digital isolators, and in particular, to a digital isolator circuit having a low-jitter function, and a digital isolator including the same.

BACKGROUND

With the improvement of science and technology, the design specifications of machines and devices in many industries, especially in industrial and medical applications, have become stricter. Therefore, a digital isolator has emerged. An isolation interface of the digital isolator, compared with an analogue isolator, is simplified. With the digital isolator, an electronic system is endowed with a high resistance isolation property to be isolated from a user. In addition, the digital isolator has the advantages of meeting safety regulations and reducing noise of a grounding loop.

However, traditional isolators still suffer from excessive signal jitter. To reduce signal jitter, the traditional digital isolator is provided with an additional isolation channel, resulting in an increase in area and cost of the circuit.

Therefore, it is necessary to design a new low-jitter digital isolator circuit and a digital isolator including the same.

SUMMARY

In order to solve one of the above problems, the present invention provides a digital isolator circuit, comprising a signal transmitting module, a signal receiving module, and an isolation channel connected between the signal transmitting module and the signal receiving module, wherein the signal transmitting module is provided with a signal input terminal, and the signal receiving module is provided with a signal output terminal; the signal transmitting module comprises a reset circuit, an oscillator and a transmitting circuit which are sequentially connected, wherein the reset circuit is connected to the signal input terminal and the transmitting circuit is connected to the isolation channel; and the signal receiving module comprises a receiving circuit connected to the isolation channel.

As a further improvement of the present invention, the reset circuit comprises a first NOT gate, a second NOT gate, an AND gate and an OR gate, wherein an input terminal of the first NOT gate is communicated with the signal input terminal and an output terminal of the first NOT gate is communicated with a first input terminal of the OR gate; an input terminal of the second NOT gate is communicated with the signal input terminal and an output terminal of the second NOT gate is connected to a second input terminal of the AND gate, and a first input terminal of the AND gate is connected to the signal input terminal; and an output terminal of the AND gate is connected to a second input terminal of the OR gate, and an output terminal of the OR gate is connected to the oscillator.

As a further improvement of the present invention, the reset circuit comprises a first delayer and a second delayer, wherein the first delayer is connected between the input terminal of the first NOT gate and the signal input terminal, and the second delayer is connected between the first input terminal of the AND gate and the signal input terminal.

As a further improvement of the present invention, delay duration of the first delayer is longer than delay duration of the second delayer.

As a further improvement of the present invention, the signal receiving module further comprises a glitch elimination circuit connected between the receiving circuit and the signal output terminal.

As a further improvement of the present invention, the oscillator comprises a third NOT gate, a fourth NOT gate, a NAND gate, and a feedback branch, wherein an input terminal of the third NOT gate is connected to the reset circuit, and an output terminal of the third NOT gate is connected to a second input terminal of the NAND gate; the feedback branch is connected between a first input terminal of the NAND gate and an output terminal of the NAND gate; and the output terminal of the NAND gate is connected to an input terminal of the fourth NOT gate, and an output terminal of the fourth NOT gate is connected to the transmitting circuit.

As a further improvement of the present invention, the feedback branch further comprises a fifth NOT gate and a sixth NOT gate which are sequentially connected in series, wherein an input terminal of the fifth NOT gate is connected to the output terminal of the NAND gate, and an output terminal of the sixth NOT gate is connected to the first input terminal of the NAND gate.

As a further improvement of the present invention, one isolation channel is disposed and the isolation channel comprises a first path and a second path, wherein a first capacitor and a second capacitor are disposed in the first path and a third capacitor and a fourth capacitor are disposed in the second path.

In order to solve one of the above problems, the present invention provides a digital isolator including the digital isolator circuit as described above.

Compared with the prior art, the digital isolator circuit according to the present invention adopts a reset circuit and an oscillator, and thus adopts an OOK modulation method with a reset function; and can achieve phase synchronization between an input signal and a clock signal of the oscillator through the reset circuit while transmitting a direct current signal and an alternating current signal, thereby reducing signal jitter generated in a signal transmission process. Thus, phase synchronization between a final output signal and the input signal is also achieved, thereby achieving more stable signal transmission and a better isolation effect. In addition, the area and cost of the digital isolator circuit are reduced as only one digital isolation channel is used.

DETAILED DESCRIPTION

In order to make a person skilled in the art better understand the technical solutions of the present invention, the technical solutions in embodiments of the present invention will be clearly and completely described below with reference to the accompanying drawings in the embodiments of the present invention. Obviously, the embodiments described are merely some but not all embodiments of the present invention. Based on the embodiments of the present invention, all other embodiments derived by a person of ordinary skill in the art without creative efforts shall fall within the protection scope of the present invention.

In various drawings of the present application, for convenience of illustration, some dimensions of the structure or part are exaggerated relative to other structures or parts, and therefore, they are only used to illustrate the basic structure of the subject matter of the present application.

As shown in FIGS. 1-4, the present invention provides a digital isolator circuit 100. The digital isolator circuit 100 includes a signal transmitting module 10, a signal receiving module 20, and an isolation channel 30 connected between the signal transmitting module 10 and the signal receiving module 20. The signal transmitting module 10 is provided with a signal input terminal, and the signal receiving module 20 is provided with a signal output terminal. The signal input terminal is an inlet at which the digital isolator circuit 100 receives an input signal TX_DATA, and the signal output terminal is an outlet at which the digital isolator circuit 100 sends an output signal RX_DATA.

Figure 1:
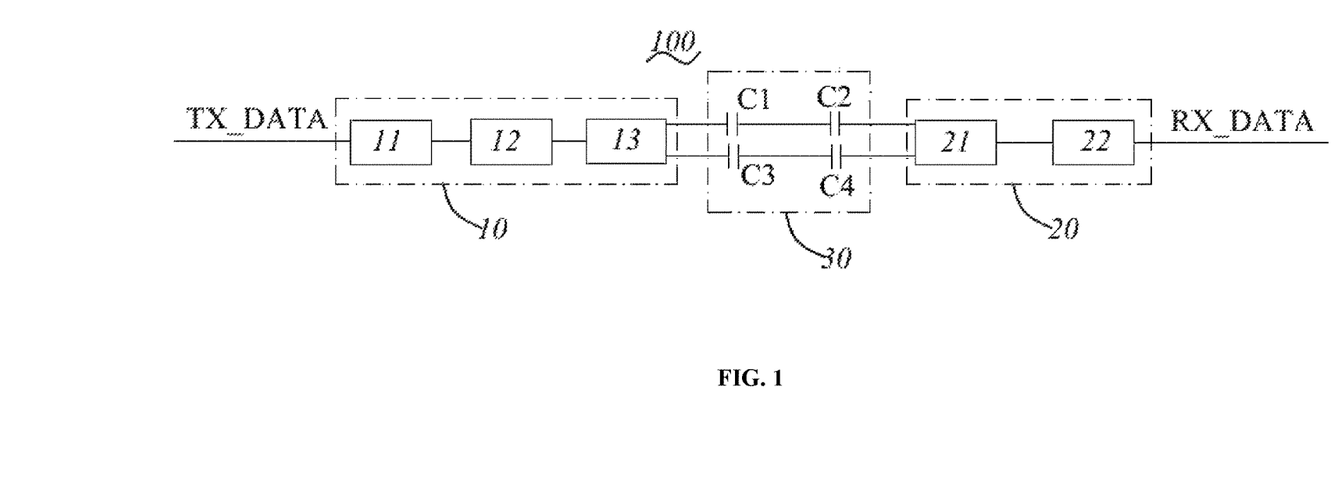
FIG. 1 is a schematic diagram of a circuit structure of a digital isolator circuit according to the present invention.

The signal transmitting module 10 includes a reset circuit 11, an oscillator 12 and a transmitting circuit 13 which are sequentially connected. The reset circuit 11 is connected to the signal input terminal and the transmitting circuit 13 is connected to the isolation channel 30. The signal receiving module 20 includes a receiving circuit 21 connected to the isolation channel 30.

Therefore, in the digital isolator circuit 100, the input signal TX_DATA sequentially passes through the reset circuit 11, the oscillator 12 and the transmitting circuit 13, then enters the signal receiving module 20 through the isolation channel 30; afterwards passes through the receiving circuit 21, and is finally output from the signal output terminal to form the output signal RX_DATA.

In addition, it should be noted that an output signal of the reset circuit is RESET, and an output signal of the oscillator is CLK.

The digital isolator circuit 100 according to the present invention adopts the reset circuit 11 and the oscillator 12, and thus adopts an OOK modulation method with a reset function; and can achieve phase synchronization between the input signal TX_DATA and the clock signal CLK of the oscillator 12 through the reset circuit 11 while transmitting a direct current signal and an alternating current signal, thereby reducing signal jitter generated in a signal transmission process. Thus, phase synchronization between the final output signal RX_DATA and the input signal TX_DATA is also achieved, thereby achieving more stable signal transmission and a better isolation effect. In addition, the area and cost of the digital isolator 100 are reduced as only one digital isolation channel 30 is used.

Figure 2:
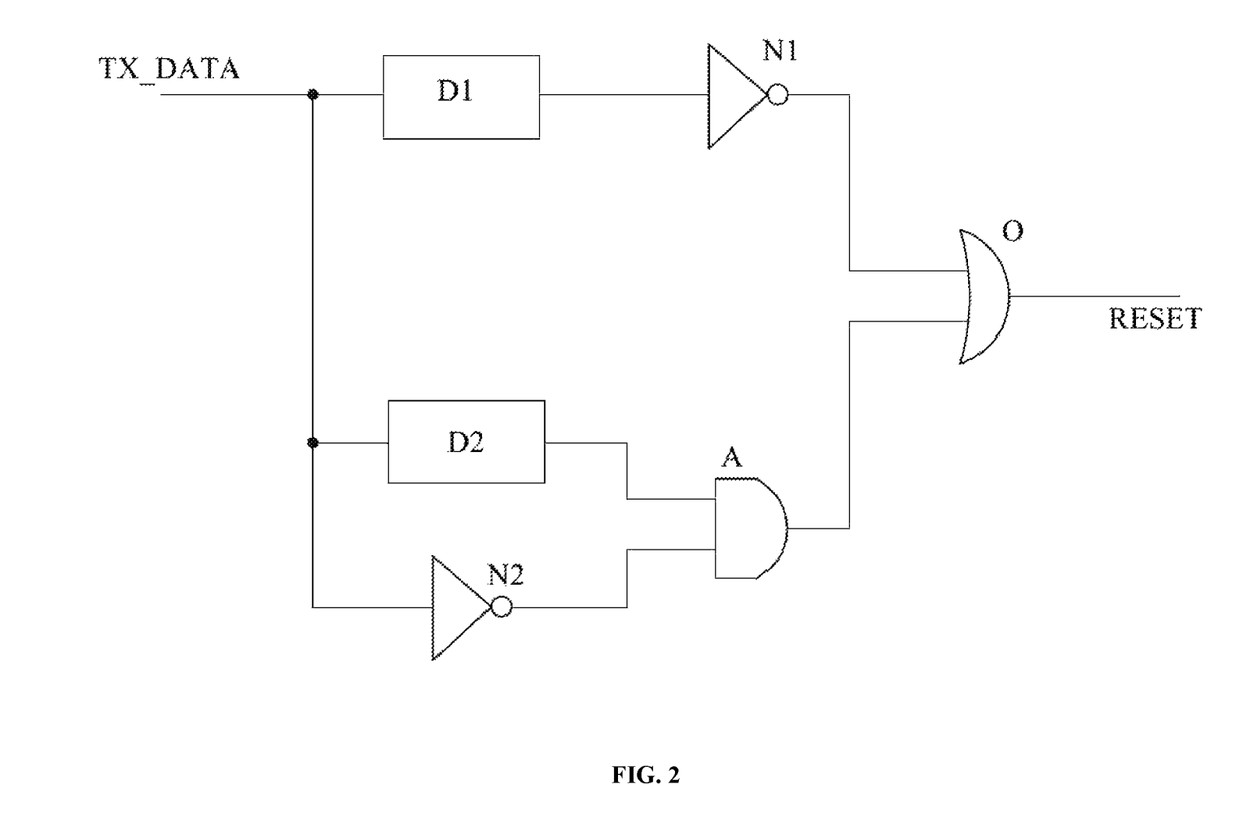
FIG. 2 is a schematic diagram of a circuit structure of a reset circuit in the present invention.

As shown in FIG. 2, in a preferred embodiment of the present invention, an input terminal of a first NOT gate N1 is communicated with the signal input terminal, and an output terminal thereof is connected to a first input terminal of an OR gate O.

An input terminal of a second NOT gate N2 is communicated with the signal input terminal, and an output terminal thereof is connected to a second input terminal of an AND gate A; and a first input terminal of the AND gate A is connected to the signal input terminal.

An output terminal of the AND gate A is connected to a second input terminal of the OR gate O, and an output terminal of the OR gate O is connected to the oscillator 12.

Through the above design, when the input signal TX_DATA is on a rising edge or a falling edge, the reset circuit 11 generates a reset signal RESET phase-synchronized with the rising edge and the falling edge of the input signal TX_DATA, so that the oscillator 12 starts or stops oscillating after the rising edge or the falling edge of the input signal TX_DATA to achieve phase synchronization between the clock signal CLK of the oscillator 12 and a transmission signal without phase accumulation.

Further, the reset circuit 11 includes a first delayer D1 and a second delayer D2. The first delayer D1 is connected between the input terminal of the first NOT gate N1 and the signal input terminal, and the second delayer D2 is connected between the first input terminal of the AND gate A and the signal input terminal.

Due to the first delayer D1 and the second delayer D2, when the input signal TX_DATA is on the rising edge or the falling edge, the reset circuit 11 does not respond immediately, but has certain delay duration. Moreover, as the delay duration between the first delayer D1 and the second delayer D2 is fixed, a change of the reset signal RESET of the reset circuit 11 and a delay of a rising edge or a falling edge of the transmission signal are fixed. Thus, the oscillator 12 starts or stops oscillating after the fixed delay of the rising edge or the falling edge of the transmission signal to achieve phase synchronization between the clock signal CLK of the oscillator 12 and the transmission signal without phase accumulation.

In addition, in order to better implement the function of the reset circuit 11 in the present invention, the delay duration of the first delayer D1 is greater than the delay duration of the second delayer D2.

Certainly, as shown in FIG. 2, the present invention only provides a preferred embodiment of the reset circuit 11. If the reset circuit 11 adopts other structures and other connection methods or selection methods are adopted for the delayers, all these also fall within the protection scope of the present invention as long as the object of the present can be achieved.

Hereinafter, specific explanation will be given in conjunction with a sequence diagram in FIG. 4.

TABLE 1

| Truth table of OR gate O | | |
|---|---|---|
| In-1 | In-2 | out |
| 0 | 1 | 1 |
| 1 | 0 | 1 |
| 1 | 1 | 1 |
| 0 | 0 | 0 |

TABLE 2

Truth table of AND gate A

| In-1 | In-2 | out |
|---|---|---|
| 0 | 1 | 0 |
| 1 | 0 | 0 |
| 1 | 1 | 1 |
| 0 | 0 | 0 |

When the input signal TX_DATA is kept at a low level 0, it is still at the low level 0 after passing through the first delayer D1 and the second delayer D2. The first NOT gate N1 outputs a high level 1, the second NOT gate N2 outputs the high level 1, the AND gate A outputs the low level 0, and thus the OR gate O outputs a low level 1.

After the input signal TX_DATA enters the rising edge, the input signal is at the high level 1 within the delay duration of the second delayer D2, and is still at the low level 0 after passing through the first delayer D1 and the second delayer D2. The first NOT gate N1 outputs the high level 1, the second NOT gate N2 outputs the low level 0, and thus the AND gate A still outputs the low level 0, and the OR gate O outputs the low level 1.

When the input signal TX_DATA is kept at the high level 1, has exceeded the delay duration of the second delayer D2, but is still within the delay duration of the first delayer D1, the input signal TX_DATA is still at the low level 0 after passing through the first delayer D1, but is at the level 1 after passing through the second delayer D2. The first NOT gate N1 outputs the high level 1, the second NOT gate N2 outputs the low level 0, the AND gate A outputs the low level 0, and the OR gate O outputs the high level 1.

When the input signal TX_DATA is kept at the high level 1 and has exceeded the delay duration of the first delayer D1, the input signal TX_DATA is at the high level 1, and is still at the high level 1 after passing through the first delayer D1 and the second delayer D2. The first NOT gate N1 outputs the low level 0, the second NOT gate N2 outputs the low level 0, the AND gate A outputs the low level 0, and the OR gate O also outputs the low level 0.

Figure 4:
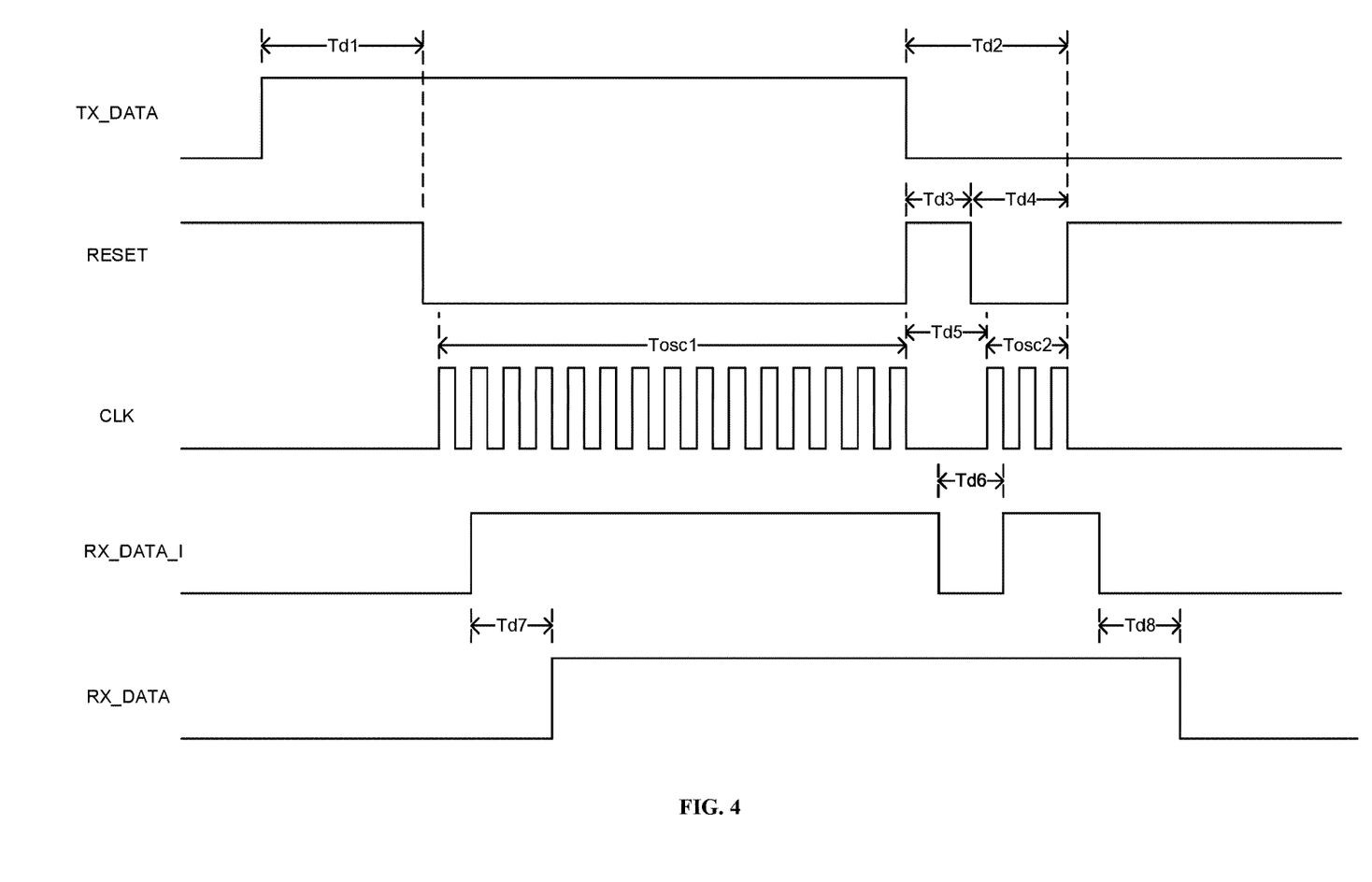
FIG. 4 is a sequence diagram of the digital isolator circuit according to the present invention in a work state.

Therefore, it can be seen that duration Td1 in FIG. 4 is the delay duration of the first delayer D1. In a stage at which the input signal TX_DATA enters the rising edge, the reset signal RESET is delayed by the duration of Td1 by setting the first delayer D1.

In a stage at which the input signal TX_DATA enters the falling edge, the input signal TX_DATA is at the low level 0. When the input signal TX_DATA is still within the delay duration of the second delayer D2, the first delayer D1 and the second delayer D2 both output the high level 1, the first NOT gate N1 outputs the low level 0, the second NOT gate N2 outputs the high level 1, the AND gate A outputs the high level 1, and the OR gate O outputs the high level 1. This is a stage with the duration of Td3 in FIG. 4.

When the input signal TX_DATA is at the low level 0, has exceeded the delay duration of the second delayer D2, but is still within the delay duration of the first delayer D1, the first delayer D1 outputs the high level 1, the first NOT gate N1 outputs the low level 0, the second delayer D2 outputs the low level 0, the second NOT gate N2 outputs the high level 1, the AND gate A outputs the low level 0, and the OR gate O outputs the low level 0. This is a stage with the duration of Td4 in FIG. 4.

The input signal TX_DATA is at the low level 0, and has exceeded the delay duration of the first delayer D1, the first delayer D1 and the second delayer D2 both output the low level 0, the first NOT gate N1 outputs the high level 1, the second NOT gate N2 outputs the high level 1, the AND gate A outputs the low level 0, and the OR gate O outputs the high level 1.

Therefore, through analysis, it can be known that the reset signal RESET has a level increase of the duration of Td3 in a Td3 stage due to the influence of the second delayer D2, so that the delay duration of the second delayer D2 is equal to Td3. The reset signal RESET has a level decrease of the duration of Td4 in a Td4 stage because the delay duration of the second delayer D2 has been exceeded, but the delay duration of the first delayer D1 has not been exceeded and the delay duration of the first delayer D1 is Td2. In addition, it can be seen from the above that the delay duration Td1 is caused by the first delayer D1 and Td1 is equal to Td2, and thus the phase of the reset signal RESET and the phase of the input signal TX_DATA can be the same without phase accumulation.

However, due to the jitter of the duration of Td2, the clock signal CLK of the oscillator 12 will not oscillate for the duration of Td5 at the same time point, and accordingly, a signal glitch of the duration of Td6 will be formed on a preliminary output signal RX_DATA_1. Therefore, the signal receiving module 20 further includes a glitch elimination circuit 22. The glitch elimination circuit 22 is connected between the receiving circuit 21 and the signal output terminal. Specifically, the reason why the oscillator 12 does not oscillate for the duration of Td5 will be described in detail later.

The glitch elimination circuit 22 can eliminate signal glitches generated when the input signal TX_DATA circulates in the reset circuit 11 and the oscillator 12, and can also be used to suppress glitches generated by other interference sources, so that the output signal RX_DATA is smoother and has higher quality. Certainly, if no signal glitch is generated by adopting the reset circuit 11 of the other structure, the glitch elimination circuit 22 can also enable the output signal RX_DATA to be smoother.

In addition, as shown in FIG. 4, the oscillator 12 may be used to generate the clock signal CLK. In the present invention, the oscillator 12 is used for implementing an OOK modulation method, and cooperates with the isolation channel 30 to form the smooth output signal RX_DATA. In addition, the phase synchronization between the clock signal CLK of the oscillator 12 and the output signal RX_DATA can also be achieved.

Figure 3:
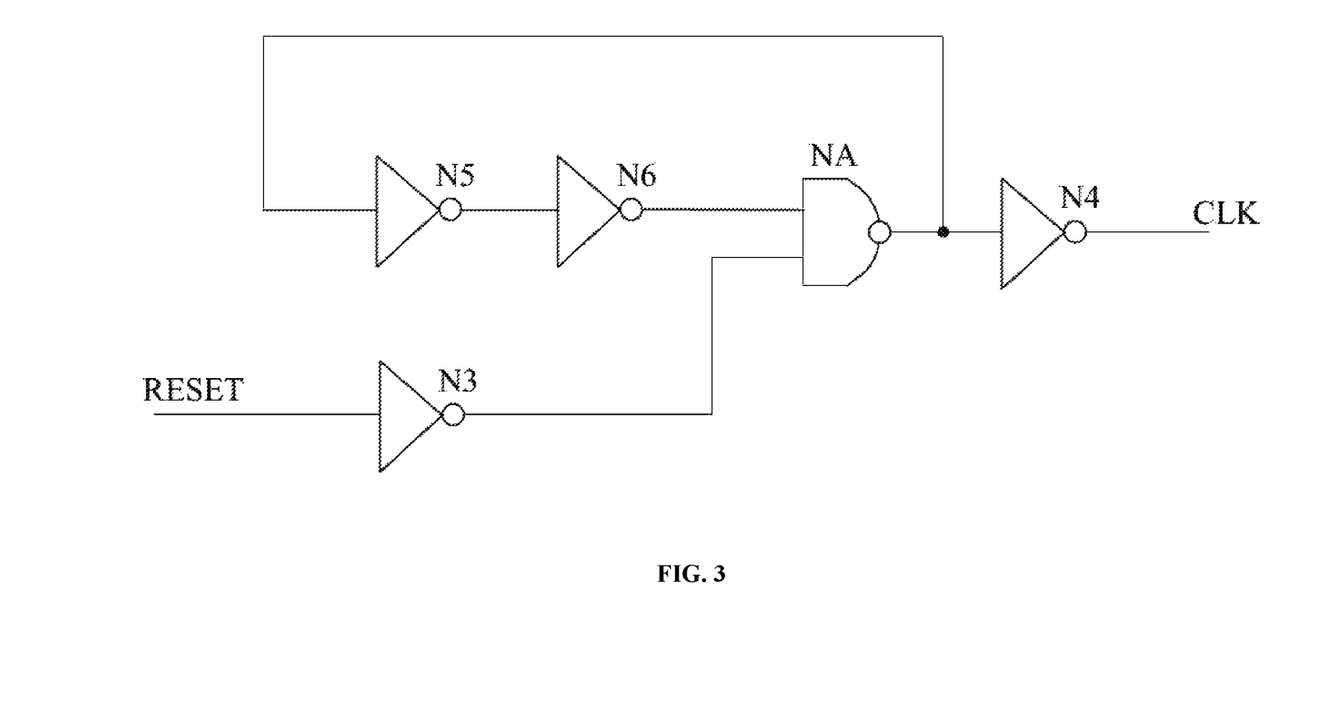
FIG. 3 is a schematic diagram of a circuit structure of an oscillator in the present invention.

Specifically, as shown in FIG. 3, the oscillator includes a third NOT gate N3, a fourth NOT gate N4, a NAND gate NA, and a feedback branch.

An input terminal of the third NOT gate N3 is connected to the reset circuit 11, and an output terminal thereof is connected to a second input terminal of the NAND gate NA.

The feedback branch is connected between a first input terminal of the NAND gate NA and an output terminal thereof.

The output terminal of the NAND gate NA is connected to an input terminal of the fourth NOT gate N4, and an output terminal of the fourth NOT gate N4 is connected to the transmitting circuit 13.

That is, the input terminal of the third NOT gate N3 is connected to the reset circuit 11 and receives the reset signal RESET. Moreover, through the above circuit connection, the clock signal CLK of the oscillator 12 is achieved. Specifically, a truth table of the NAND gate NA is known as follows.

TABLE 3

Truth table of NAND gate NA

| In-1 | In-2 | out |
|---|---|---|
| 0 | 0 | 1 |
| 0 | 1 | 1 |
| 1 | 0 | 1 |
| 1 | 1 | 0 |

In conjunction with FIG. 4, it can be known that when the reset signal RESET is at the high level 1, the third NOT gate N3 outputs the low level 0, the NAND gate NA can only output the high level 1, the fourth NOT gate N4 outputs the low level 0, and thus the clock signal CLK can only be at the low level 0.

Then, the reset signal RESET enters a falling edge and is at the low level 0, and the third NOT gate N3 outputs the high level 1. As the high level 1 previously outputted by the NAND gate NA at the output terminal is connected to the first input terminal of the NAND gate NA through the feedback branch, the NAND gate NA outputs the low level 0, and the fourth NOT gate N4 outputs the high level 1. Thus, the level of the clock signal CLK becomes 1.

Afterwards, the reset signal RESET continues to be kept at the low level 0. As the low level 0 outputted again by the NAND gate NA at the output terminal in the previous step is connected to the first input terminal of the NAND gate NA through the feedback branch, the NAND gate NA outputs the high level 1 again and the fourth NAND gate N4 outputs the low level 0. Thus, the level of the clock signal CLK becomes 0.

Therefore, the oscillator 12 can oscillate, furthermore, starts oscillating when the reset signal RESET enters the falling edge and is kept at the low level, and is kept at the low level when the reset signal RESET is at the high level. Hence, as described above, the jitter of the duration of Td2 is formed on the reset signal RESET by setting the reset circuit 11, which is mainly a high level of duration of Td3 and a low level of duration of Td4. Thus, when the reset signal RESET is at the high level of the duration of Td3, the clock signal CLK of the oscillator 12 is kept at the low level and no oscillation is generated. The oscillator 12 does not start oscillating until the reset signal RESET returns to the low level again. Once the duration of Td4 elapses, the oscillator 12 quickly stops oscillating again.

Certainly, only the preferred circuit structure of the oscillator 12 in the present invention is described above. If other oscillators 12 are used, they can also fall within the scope of protection of the present invention as long as they can achieve the object of the present invention.

In addition, the feedback branch further includes a fifth NOT gate N5 and a sixth NOT gate N6 which are sequentially connected in series. An input terminal of the fifth NOT gate N5 is connected to the output terminal of the NAND gate NA, and an output terminal of the sixth NOT gate N6 is connected to the first input terminal of the NAND gate NA. Therefore, the circuit of the oscillator 12 can work smoother, and the series connection of two NOT gates does not affect the implementation of the function of the oscillator 12 in the present invention.

In addition, one isolation channel 30 is disposed and the isolation channel includes a first path and a second path. The first path is provided with a first capacitor C1 and a second capacitor C2, and the second path is provided with a third capacitor C3 and a fourth capacitor C4. The clock signal CLK of the oscillator 12 may be converted to a smooth preliminary output signal RX_DATA_1 by charging and discharging the capacitors in the first path and the second path. Specifically, for example, when the first capacitor C1 is charged, the third capacitor C3 discharges to the fourth capacitor C4. When the first capacitor C1 charges the second capacitor C2, the fourth capacitor C4 is fully charged and discharges to the signal receiving module 20. When the second capacitor C2 is fully charged and discharges to the signal receiving module 20, the third capacitor C3 starts to charge again. Therefore, the clock signal CLK may be converted to the preliminary output signal RX_DATA_1 as shown in FIG. 4 by this circulation.

Therefore, through the isolation channel 30, the clock signal CLK may be converted to the preliminary output signal RX_DATA_1. In addition, as non-oscillation of the duration of Td5 is formed in the clock signal CLK, the signal glitch of the duration of Td6 is formed in the preliminary output signal RX_DATA_1. As mentioned above, in the present invention, the glitch elimination circuit 22 is also disposed to eliminate the signal glitch. Moreover, although the glitch elimination circuit 22 generates certain delay when eliminating the signal glitch, the phase synchronization between the preliminary output signal RX_DATA_1 and the output signal RX_DATA is still maintained, so that the output signal RX_DATA and the input signal TX_DATA are also phase-synchronized.

The present invention also relates to a digital isolator. The digital isolator includes the digital isolator circuit 100 as described above.

In summary, the present invention provides the digital isolator circuit 100 and the digital isolator including the same. The digital isolator circuit 100 according to the present invention adopts the reset circuit 11 and the oscillator 12 and thus adopts the OOK modulation method with the reset function, and can achieve phase synchronization between the input signal TX_DATA and the clock signal CLK of the oscillator 12 through the reset circuit 11 while transmitting a direct current signal and an alternating current signal, thereby reducing the signal jitter generated in a signal transmission process. In addition, the area and cost of the digital isolator circuit 100 are reduced as only one digital isolation channel 30 is used.

In addition, in the present invention, the reset circuit 11 includes the first delayer D1 and the second delayer D2 which can form the fixed delay, so that there may be a fixed phase difference between the clock signal CLK of the oscillator 12 and the input signal TX_DATA without phase accumulation, thereby achieving phase synchronization between the input signal TX_DATA and the clock signal CLK and reducing the signal jitter caused by a discrepancy of phase difference between the input signal TX_DATA and the clock signal CLK in a transmission process.

Further, in the present invention, the glitch elimination circuit 22 is also adopted, can eliminate the signal glitch caused by the reset signal RESET in the preliminary output signal RX_DATA_1, and can also suppress the signal glitch generated by other interference sources, so that the output signal RX_DATA is smoother.

In addition, it should be understood that although the description is described according to the embodiments, not every embodiment includes only one independent technical solution. This presentation manner of the description is only for clarity. Those skilled in the art should consider the description as a whole, and technical solutions in all of the embodiments may also be properly combined to form other embodiments that will be understood by those skilled in the art.

The above detailed description only aims to specifically illustrate the feasible embodiments of the present invention, and is not intended to limit the scope of protection of the present invention. Equivalent embodiments or modifications thereof made without departing from the technical spirit of the present invention shall fall within the scope of protection of the present invention.

What is claimed is:

1. A low-jitter digital isolator circuit, comprising a signal transmitting module, a signal receiving module, and an isolation channel connected between the signal transmitting module and the signal receiving module, wherein the signal transmitting module is provided with a signal input terminal, and the signal receiving module is provided with a signal output terminal;

the signal transmitting module comprises a reset circuit, an oscillator and a transmitting circuit which are sequentially connected, wherein the reset circuit is connected to the signal input terminal and the transmitting circuit is connected to the isolation channel; and the signal receiving module comprises a receiving circuit connected to the isolation channel;

wherein one isolation channel is disposed and the isolation channel comprises a first path and a second path, wherein a first capacitor and a second capacitor are disposed in the first path and a third capacitor and a fourth capacitor are disposed in the second path.

2. The digital isolator circuit according to claim 1, wherein the reset circuit comprises a first NOT gate, a second NOT gate, an AND gate and an OR gate, wherein:

an input terminal of the first NOT gate is communicated with the signal input terminal and an output terminal of the first NOT gate is communicated with a first input terminal of the OR gate;

an input terminal of the second NOT gate is communicated with the signal input terminal and an output terminal of the second NOT gate is connected to a second input terminal of the AND gate, and a first input terminal of the AND gate is connected to the signal input terminal; and an output terminal of the AND gate is connected to a second input terminal of the OR gate, and an output terminal of the OR gate is connected to the oscillator.

3. The digital isolator circuit according to claim 2, wherein the reset circuit comprises a first delayer and a second delayer, wherein the first delayer is connected between the input terminal of the first NOT gate and the signal input terminal, and the second delayer is connected between the first input terminal of the AND gate and the signal input terminal.

4. The digital isolator circuit according to claim 3, wherein delay duration of the first delayer is longer than delay duration of the second delayer.

5. The digital isolator circuit according to claim 1, wherein the signal receiving module further comprises a glitch elimination circuit connected between the receiving circuit and the signal output terminal.

6. The digital isolator circuit according to claim 1, wherein the oscillator comprises a third NOT gate, a fourth NOT gate, a NAND gate, and a feedback branch, wherein:

an input terminal of the third NOT gate is connected to the reset circuit, and an output terminal of the third NOT gate is connected to a second input terminal of the NAND gate;

the feedback branch is connected between a first input terminal of the NAND gate and an output terminal of the NAND gate; and the output terminal of the NAND gate is connected to an input terminal of the fourth NOT gate, and an output terminal of the fourth NOT gate is connected to the transmitting circuit.

7. The digital isolator circuit according to claim 6, wherein the feedback branch further comprises a fifth NOT gate and a sixth NOT gate which are sequentially connected in series, wherein an input terminal of the fifth NOT gate is connected to the output terminal of the NAND gate, and an output terminal of the sixth NOT gate is connected to the first input terminal of the NAND gate.

8. A digital isolator, comprising the digital isolator circuit according to claim 1.

* * * * *